(12) United States Patent
Hsu et al.

(10) Patent No.: US 7,999,342 B2
(45) Date of Patent: Aug. 16, 2011

(54) IMAGE SENSOR ELEMENT FOR BACKSIDE-ILLUMINATED SENSOR

(75) Inventors: Tzu-Hsuan Hsu, Kaohsiung (TW);
Dun-Nian Yaung, Taipei (TW);
Ching-Chun Wang, Tainan (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 38 days.

(21) Appl. No.: 11/859,848

(22) Filed: Sep. 24, 2007

(65) Prior Publication Data
US 2009/0078973 A1 Mar. 26, 2009

(51) Int. Cl.
*H01L 31/0232* (2006.01)

(52) U.S. Cl. .. 257/447; 257/448; 257/462; 257/E31.079

(58) Field of Classification Search .................. 257/292, 257/293, 462, E31.053, E31.073, E31.079, 257/44
See application file for complete search history.

(56) References Cited

U.S. PATENT DOCUMENTS

| | | |
|---|---|---|
| 3,617,753 A | 11/1971 | Kato et al. |
| 3,995,309 A | 11/1976 | Torreno |
| 4,001,878 A | 1/1977 | Weimer |
| 4,154,632 A | 5/1979 | Mochizuki et al. |
| 4,190,852 A | 2/1980 | Warner |
| 4,193,826 A | 3/1980 | Mochizuki et al. |
| 4,199,386 A | 4/1980 | Rosnowski et al. |
| 4,290,830 A | 9/1981 | Mochizuki et al. |
| 4,481,522 A | 11/1984 | Jastrzebski et al. |
| 4,507,674 A * | 3/1985 | Gaalema ...................... 257/436 |
| 4,760,031 A | 7/1988 | Janesick |
| 4,764,480 A * | 8/1988 | Vora ............................... 438/203 |
| 5,005,063 A | 4/1991 | Janesick |
| 5,244,817 A | 9/1993 | Hawkins et al. |
| 5,473,181 A | 12/1995 | Schwalke et al. |
| 5,508,625 A | 4/1996 | Adams |
| 5,511,428 A | 4/1996 | Goldberg |
| 5,661,043 A | 8/1997 | Rissman et al. |
| 5,792,377 A | 8/1998 | Belcher et al. |
| 5,895,944 A | 4/1999 | Yamada |
| 5,900,623 A * | 5/1999 | Tsang et al. ............... 250/208.1 |

(Continued)

FOREIGN PATENT DOCUMENTS

CN 1229526 A 9/1999

(Continued)

OTHER PUBLICATIONS

Theuwissen, A.J.P.; Bosiers, J.T.; Roks, E., "The hole role," Electron Devices Meeting, 2005. IEDM Technical Digest. IEEE International, vol., No., pp. 799-802, 5-5 Dec. 2005.*

(Continued)

*Primary Examiner* — A. Sefer
*Assistant Examiner* — Allen L Parker
(74) *Attorney, Agent, or Firm* — Haynes and Boone, LLP

(57) ABSTRACT

Provided is a backside-illuminated sensor including a semiconductor substrate having a front surface and a back surface. A plurality of image sensor elements are formed on the front surface of the semiconductor substrate. At least one of the image sensor elements includes a transfer transistor and a photodetector. The gate of the transfer transistor includes an optically reflective layer. The gate of the transfer transistor, including the optically reflective layer, overlies the photodetector. In one embodiment, the gate overlies the photodetector by at least 5%.

14 Claims, 8 Drawing Sheets

U.S. PATENT DOCUMENTS

| | | | |
|---|---|---|---|
| 6,012,336 A | 1/2000 | Eaton et al. | |
| 6,168,965 B1 | 1/2001 | Malinovich et al. | |
| 6,169,319 B1 | 1/2001 | Malinovich et al. | |
| 6,227,055 B1 | 5/2001 | Pitzer | |
| 6,259,085 B1 | 7/2001 | Holland | |
| 6,269,199 B1* | 7/2001 | Maloney | 385/14 |
| 6,331,873 B1 | 12/2001 | Burke et al. | |
| 6,429,036 B1 | 8/2002 | Nixon et al. | |
| 6,501,092 B1* | 12/2002 | Nikonov et al. | 257/29 |
| 6,504,193 B1* | 1/2003 | Ishiwata et al. | 257/291 |
| 6,504,196 B1 | 1/2003 | Rhodes | |
| 6,518,085 B1 | 2/2003 | Wang et al. | |
| 6,635,912 B2 | 10/2003 | Ohkubo | |
| 6,670,258 B2 | 12/2003 | Carlson et al. | |
| 6,765,276 B2 | 7/2004 | Fasen et al. | |
| 6,815,791 B1* | 11/2004 | Dierickx | 257/461 |
| 6,821,809 B2 | 11/2004 | Abe et al. | |
| 6,849,469 B1 | 2/2005 | Thuruthiyil et al. | |
| 6,884,651 B2 | 4/2005 | Toyoda et al. | |
| 6,946,352 B2 | 9/2005 | Yaung | |
| 7,005,637 B2 | 2/2006 | Costello et al. | |
| 7,042,060 B2 | 5/2006 | Costello et al. | |
| 7,074,639 B2 | 7/2006 | Burke et al. | |
| 7,148,464 B2 | 12/2006 | Shibayama | |
| 7,232,697 B2 | 6/2007 | Hsu et al. | |
| 7,535,073 B2 | 5/2009 | Ezaki | |
| 2001/0012225 A1 | 8/2001 | Rhodes | |
| 2001/0017344 A1 | 8/2001 | Aebi | |
| 2002/0011614 A1 | 1/2002 | Rhodes | |
| 2002/0135034 A1 | 9/2002 | Shigenaka et al. | |
| 2003/6552712 | 4/2003 | Koizumi | |
| 2004/0149888 A1 | 8/2004 | Costello | |
| 2004/0169625 A1 | 9/2004 | Park et al. | |
| 2004/0178350 A1 | 9/2004 | Nagano et al. | |
| 2004/0245642 A1 | 12/2004 | Hasunuma et al. | |
| 2005/0090035 A1 | 4/2005 | Kim | |
| 2005/0106872 A1 | 5/2005 | Hong et al. | |
| 2005/0110050 A1 | 5/2005 | Walschap et al. | |
| 2005/0167709 A1 | 8/2005 | Augusto | |
| 2005/0179053 A1 | 8/2005 | Ezaki et al. | |
| 2005/0184322 A1 | 8/2005 | Inoue | |
| 2005/0205954 A1 | 9/2005 | King et al. | |
| 2005/0233493 A1 | 10/2005 | Augusto | |
| 2005/0255625 A1* | 11/2005 | Janesick et al. | 438/57 |
| 2005/0287479 A1 | 12/2005 | Moon | |
| 2006/0043519 A1 | 3/2006 | Ezaki | |
| 2006/0057759 A1 | 3/2006 | Zhang et al. | |
| 2006/0084195 A1* | 4/2006 | Lyu | 438/48 |
| 2006/0086956 A1* | 4/2006 | Furukawa et al. | 257/291 |
| 2006/0121640 A1 | 6/2006 | Kim | |
| 2006/0138498 A1 | 6/2006 | Kim | |
| 2006/0197171 A1 | 9/2006 | Zhang et al. | |
| 2006/0249803 A1 | 11/2006 | Yamamoto et al. | |
| 2006/0267123 A1 | 11/2006 | Wu et al. | |
| 2006/0275945 A1 | 12/2006 | Yang et al. | |
| 2006/0281215 A1 | 12/2006 | Maruyama et al. | |
| 2007/0001100 A1 | 1/2007 | Hsu et al. | |
| 2007/0013020 A1* | 1/2007 | Blauvelt et al. | 257/447 |
| 2007/0023800 A1 | 2/2007 | Ohkawa | |
| 2007/0052050 A1 | 3/2007 | Dierickx | |
| 2007/0108476 A1 | 5/2007 | Hong | |
| 2007/0117253 A1 | 5/2007 | Hsu et al. | |
| 2007/0207566 A1 | 9/2007 | Fu et al. | |
| 2008/0108167 A1 | 5/2008 | Abe et al. | |
| 2008/0173963 A1 | 7/2008 | Hsu et al. | |
| 2008/0265348 A1 | 10/2008 | Maas et al. | |

FOREIGN PATENT DOCUMENTS

| | | |
|---|---|---|
| CN | 1763965 | 4/2006 |
| CN | 1776917 A | 5/2006 |
| CN | 1877845 A | 12/2006 |
| CN | 1905201 A | 1/2007 |
| JP | 64082666 | 3/1989 |
| JP | 07202161 | 8/1995 |
| JP | 2004233758 | 8/2004 |
| JP | 2004241653 | 8/2004 |
| JP | 2004319610 | 11/2004 |
| KR | 1020020005990 | 1/2002 |
| KR | 102005103782 | 11/2005 |
| WO | 9859373 | 12/1998 |

OTHER PUBLICATIONS

U.S. Appl. No. 11/424,286, filed Jun. 15, 2006.
U.S. Appl. No. 11/753,480, filed May 24, 2007.
Williams, George M., "Back-Illuminated CCD Imagers for High Information Content Digital Photography", SPIE, vol. 3302, Apr. 1998, pp. 39-53.
Japanese Patent Office, Office Action mailed Jul. 17, 2009; Application No. 2006175291; 4 pages.
Korean Intellectual Property Office, Notice of Preliminary Rejection mailed May 28, 2008; Korean Patent Application No. 10-2007-0045138; 8 pages.

* cited by examiner

IMAGE SENSOR ELEMENT FOR BACKSIDE-ILLUMINATED SENSOR

BACKGROUND

The present disclosure relates generally to semiconductor devices and, more particularly, to backside-illuminated image sensors.

This application is related to U.S. application Ser. No. 11/424,286 filed Jun. 15, 2006, and U.S. application Ser. No. 11/753,480 filed May 24, 2007, which are hereby incorporated by reference.

In semiconductor technologies, backside-illuminated sensors are used for sensing a volume of radiation (e.g. light) projected towards the back surface of a substrate. To do this, an image sensor device uses an array of image sensor elements (e.g. pixels). Each image sensor element includes at least one radiation sensing element, described herein, as a photodetector. The photodetectors may be formed on the front side of the substrate, the substrate being thin enough to allow the radiation incident on the back surface of the substrate to reach the photodetectors. A thin substrate may be advantageous in reducing optical and/or electrical cross-talk between image sensor elements. However, a thin substrate may also degrade the sensor performance, for example, by degrading quantum efficiency (e.g. its ability to convert radiation into a signal) in particular for long wavelengths of visible light (e.g. 650 nm). Each image sensor element also typically includes at least one transistor coupled to the photodetector. Such transistors must be optimized for example to prevent "punch through."

As such, an improved backside-illuminated image sensor is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to image sensors and more particularly, to a backside-illuminated image sensor. It is understood, however, that specific embodiments are provided as examples to teach the broader inventive concept, and one of ordinary skill in the art can easily apply the teaching of the present disclosure to other methods or apparatus. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, overlapping, overlying, underlying and the like, a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, or on a surface of a substrate, may include embodiments where features are formed above the surface of the substrate, adjacent to the surface of the substrate, directly on the surface of the substrate, and/or extending below the surface of the substrate (such as implanted regions).

Figure 1:
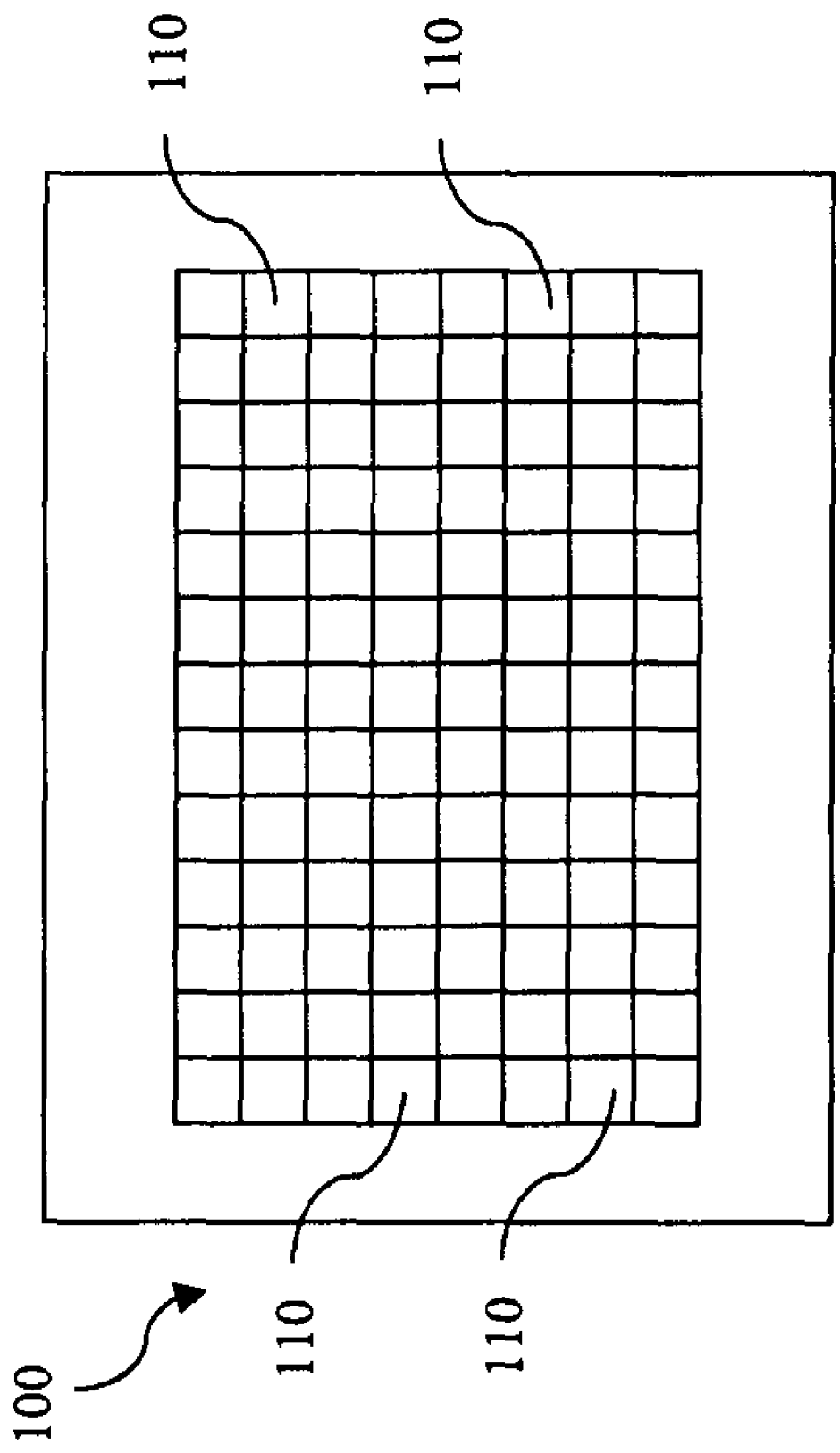
FIG. 1 is a top view of a sensor device including a plurality of image sensor elements (or pixels).

Referring to FIG. 1, an image sensor device 100 provides an array of image sensor elements 110 (e.g. pixels). The image sensor device 100 may be a complimentary metal oxide semiconductor (CMOS) image sensor (CIS) or active pixel sensor. In other embodiments, the image sensor device 100 is a charge coupled device (CCD) sensor or passive pixel sensor. The image sensor device 100 is a backside-illuminated (BSI) sensor. The image sensor elements 110 include photodetectors for measuring an intensity or brightness of radiation. In an embodiment, a photodetector included in an image sensor element 110 includes a photodiode. In a further embodiment, a photodetector includes a pinned photodiode. Other examples of photodetectors include photogate detectors, phototransistors, and/or other detectors known in the art. The image sensor elements 110 may also include reset transistors, source follower transistors, selector transistors, and/or transfer transistors. In several of the embodiments illustrated below, image sensor elements are depicted as four transistor elements (or 4T structure), however various other configures are possible, including, for example, a 5T structure. Additional circuitry and input/outputs are typically provided adjacent to the array of image sensor elements 110 for providing an operation environment for the image sensor elements 110 and for supporting external communications with the image sensor elements 110. For simplicity, image sensors including a single image sensor element are described in the present disclosure; however, typically an array of such image sensor elements may form a sensor device, as illustrated in FIG. 1.

Figure 2:
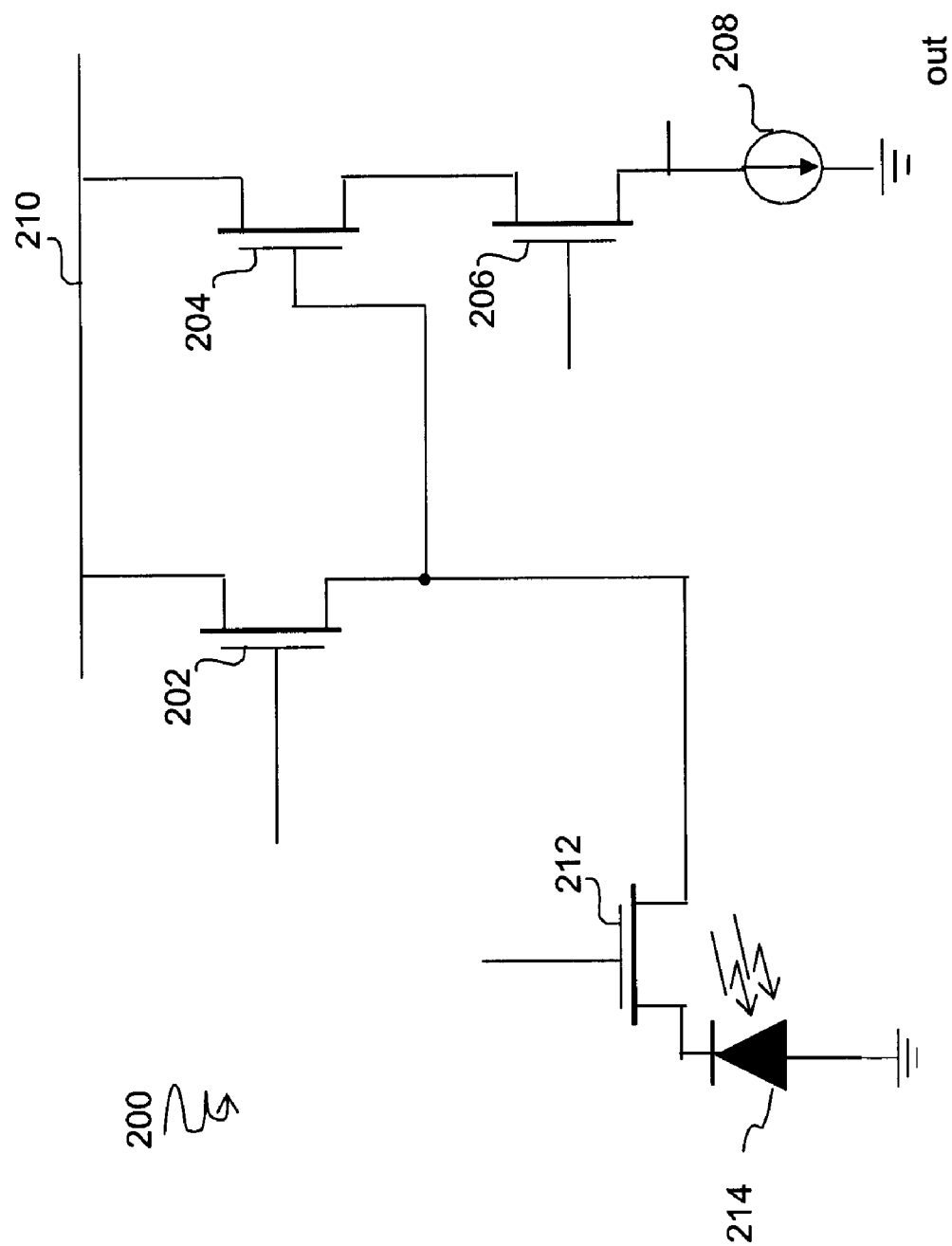
FIG. 2 is a schematic of an embodiment of an image sensor element.

Referring now to FIG. 2, a schematic of an image sensor element 200 is illustrated. The image sensor element 200 includes a reset transistor 202, a source follower transistor 204, a selector transistor 206, a transfer transistor 212 (or transfer gate transistor), and a photodetector 214, illustrated as a photodiode. The photodetector 214 is connected in series with the transfer transistor 212. The transfer transistor 212 is connected in series with the reset transistor 202. The gate of the source follower transistor 204 is connected to the source of the reset transistor 202. The drain of the source follower transistor 204 is connected to a power supply 210. The selector transistor 206 is connected in series to the source follower transistor 204. The reset transistor 202 can act to reset the image sensor element 200, e.g. by resetting the floating diffusion region (or floating node) described below. The source follower transistor 204 may allow the voltage of the image sensor element 200 to be observed without removing the accumulated charge. The selector transistor 206 may be a row-select transistor and allow a single row of image sensor elements in an array, such as illustrated in the array of FIG. 1, to be read when the selector transistor 206 is turned on. The drain of the transfer transistor 212 includes a floating diffusion region, described below. The transfer transistor 212 can move signal charges accumulated in the photodetector 214 to the floating diffusion region. For example, the transfer gate (or gate of the transfer transistor) controls the transfer of electrons between the photodetector 214 and the floating diffusion region. As the floating diffusion region is coupled to the gate of the source follower transistor 204, if the selector transistor 206 is turned on (i.e. the row is selected), data is output from the image sensor element. In an embodiment, the transfer transistor 212 allows for correlated double sampling. The photodetector 214 is coupled to ground. A constant current source 208 is also included in the image sensor element 200.

Figure 3:
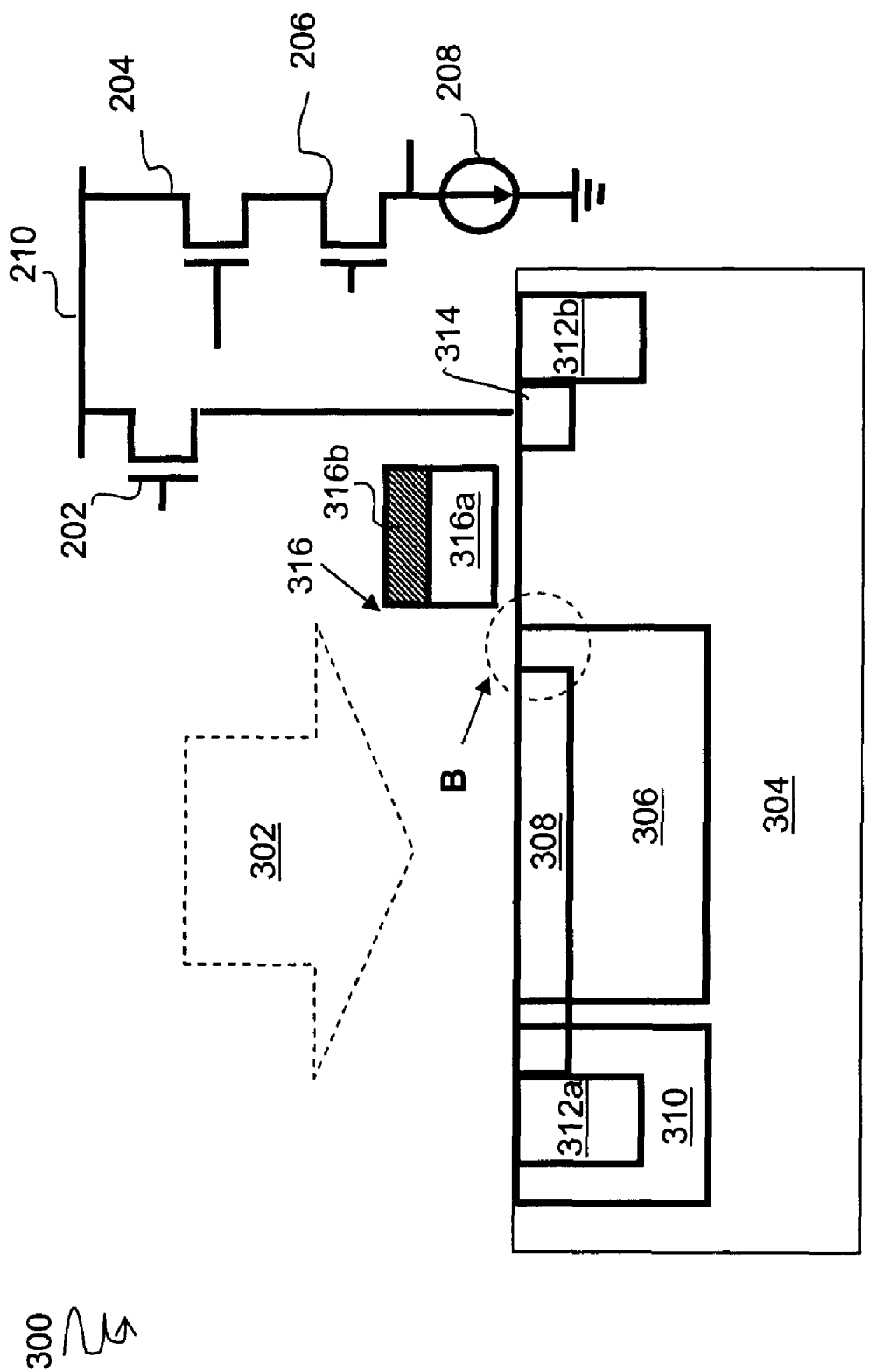
FIG. 3 is a cross-section of an embodiment of an image sensor element configured to sense radiation incident on the front surface of the sensor.

Referring now to FIG. 3, a cross-section of an image sensor element 300 is illustrated. The image sensor element 300 includes a transfer transistor and a photodetector depicted in cross section, as described in detail below, and the reset transistor 202, the source follower transistor 204, the selector transistor 206, the current source 208, and the power supply 210 depicted in schematic form. The image sensor element 300 includes a substrate 304, a photodetector including a photogeneration region 306 and an implant region 308 (illustrated as a pinned photodiode), a floating diffusion region (or floating node) 314, in addition to a well region 310 and shallow trench isolation regions 312a and 312b. In an embodiment, the image sensor element 300 is configured such that the substrate 304 includes a p-type region, the photogeneration region 306 is an n type region, and the implant region 308 is a p type region. The well region 310 may be a p-type well helpful to provide isolation between image sensor elements. The image sensor element 300 is configured to measure radiation incident on the front surface of the substrate 304, as illustrated by radiation beam 302. The transfer transistor includes a transfer gate 316. The transfer gate 316 includes a polysilicon gate electrode 316a and silicide region 316b. The transfer transistor may further include a gate dielectric layer (not illustrated) interposing the gate electrode 316a and the substrate 304.

The image sensor element 300 may be disadvantageous in that front illuminated sensors may provide for lower fill factor (e.g. photodetector exposed area per pixel) and higher destructive interference than a backside-illuminated sensor. Furthermore, the image sensor element 300 may include issues such as a barrier to transfer of charges accumulated in the photogeneration region 306. That is, due to the close proximity of the implant region 308 and the p-type substrate 304 (as illustrated by the reference circle B), the charges accumulated in photogeneration region 306 may experience a barrier (e.g. resistance) to transfer to the floating diffusion region 314. This barrier may result from the influence of the p type implant region 308 on the transfer. Such a barrier may lead to the image sensor element 300 experiencing image lag.

Figure 4:
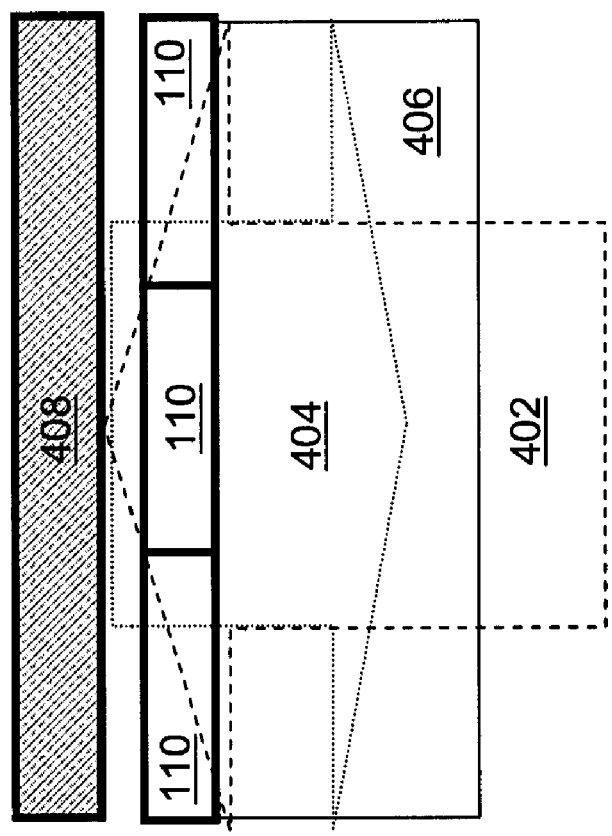
FIG. 4 is a cross-section of an embodiment of a plurality of image sensor elements of a backside-illuminated image sensor device.

Referring now to FIG. 4, illustrated is an image sensor device 400 including a plurality of image sensor elements 110 formed on a substrate 406. Disposed above the image sensor elements 110 is a light-reflective layer 408. The light-reflective layer 408 is contiguous across a plurality of image sensor elements 110 (e.g. across a plurality of pixels). The image sensor device 400 is configured to measure radiation incident upon the back surface of the substrate 406 as illustrated by incident radiation beam 402. The light-reflective layer 408 is configured to reflect the portion of the incident radiation beam 402 that may not be absorbed by the substrate 406 and/or the image sensing elements 110. This radiation is then reflected back towards the image sensing elements 110, as illustrated by reflected radiation beam 404. Disadvantages of such an image sensor device 400 may include additional fabrication processes to form the light-reflective layer 408.

Figure 5:
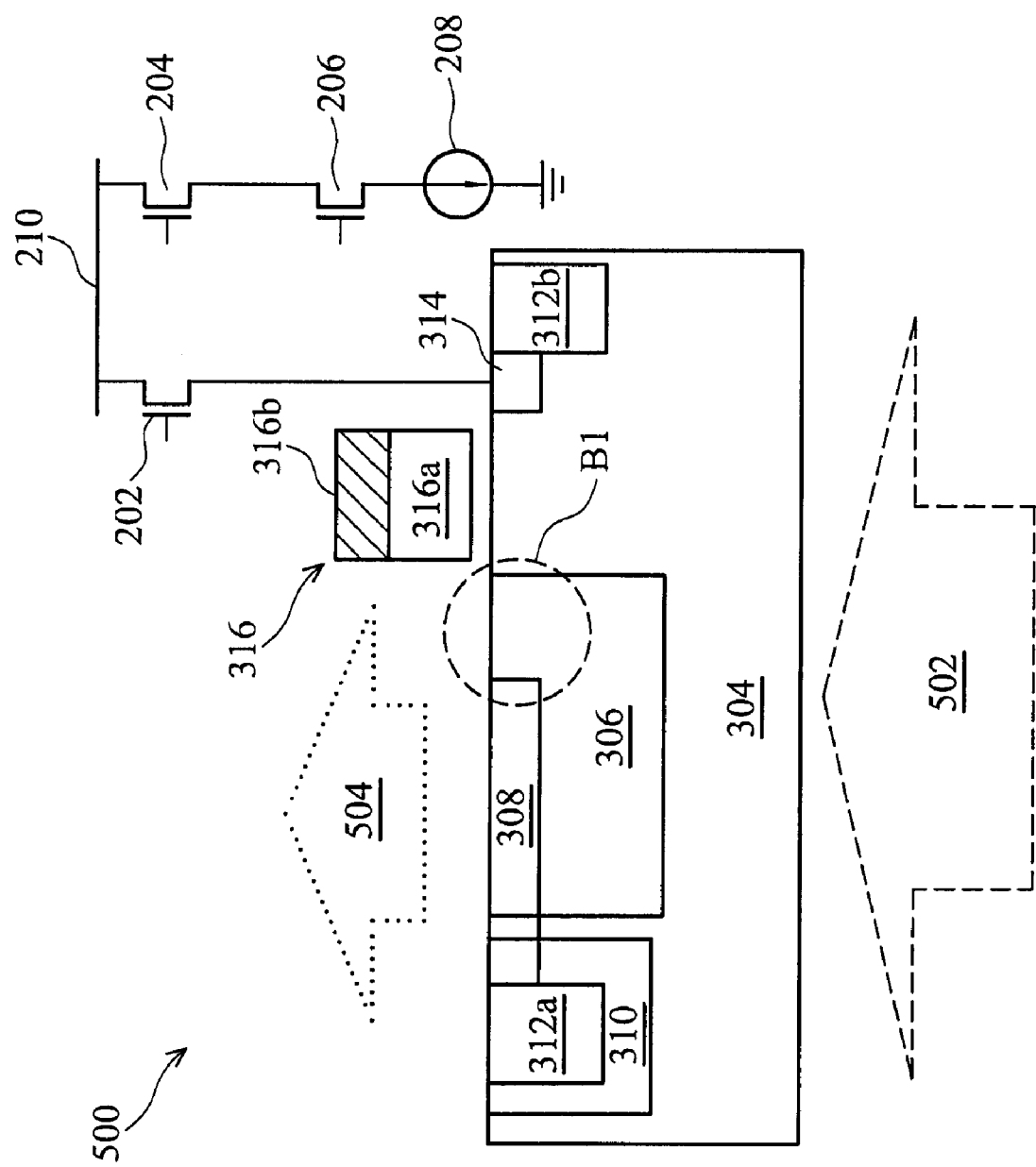
FIG. 5 is a cross-section of an embodiment of an image sensor element of a backside-illuminated image sensor device.

Referring now to FIG. 5, a cross-section of an image sensor element 500 is illustrated. The image sensor element 500 includes a transfer transistor and a photodetector depicted in cross section, as described in detail below, and a reset transistor 202, a source follower transistor 204, a selector transistor 206, a current source 208, and a power supply 210, depicted in schematic form. The image sensor element 500 includes a substrate 304, a pinned photodiode structure including a photogeneration region 306 and an implant area 308, a well region 310, shallow trench isolation regions 312a and 312b, and a floating diffusion region 314. In an embodiment, the image sensor element 500 is configured such that the substrate 304 includes a p-type region, the photogeneration region 306 is an n type region, the implant region 308 is a p type region. The well region 310 may be a p-type well helpful to provide isolation between image sensor elements. The image sensor element 500 is configured to measure radiation incident on the back surface of the substrate 304, as illustrated by radiation beam 502.

The disadvantages of the image sensor element 500 may include a portion of the incident radiation 502 not being absorbed, and thus, not being measured by the image sensor element 500. This is illustrated in FIG. 5 as non-absorbed radiation beam 504. Furthermore, the image sensor element 500 may include issues such as a barrier to transfer of charges accumulated in the photogeneration region 306. That is, due to the close proximity of the implant region 308 and the p-type substrate 304 (as illustrated by the reference circle B1), the charges accumulated in photogeneration region 306 may experience a barrier (e.g. resistance) to transfer to the floating diffusion region 314. This barrier may result from the influence of the p type implant region 308 on the transfer. Such a barrier may lead to the image sensor element 500 experiencing image lag.

Another disadvantage of the image sensor elements 300 and 500 is associated with the formation of the transfer gate on the substrate. The transfer gate may be formed using photolithography processes known in the art. Such processes however, require the deposition of photoresist to provide for patterning of the gate structure, etching of the gate structure, and stripping of photoresist. These processes may cause surface damage to the substrate including the exposed photodetector. As such, a process of forming a transfer gate that protects the surface of the substrate including the surface of the photodetector is desired.

Figure 6:
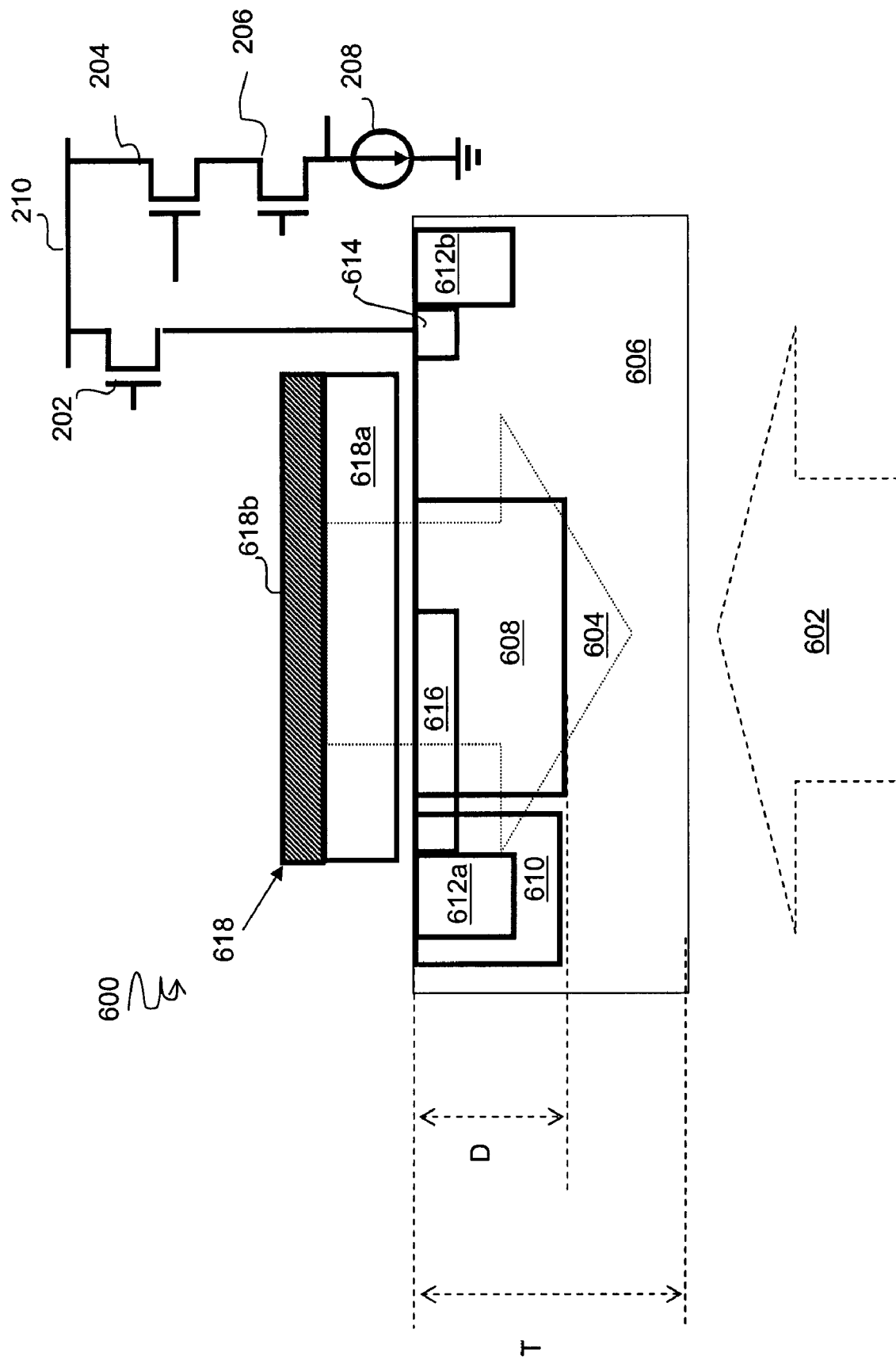
FIG. 6 is a cross-section of an embodiment of an image sensor element of a backside-illuminated image sensor device benefiting from the current disclosure.

Referring now to FIG. 6, illustrated is an image sensor element 600. The image sensor element 600 includes a transfer transistor and a photodetector depicted in cross section, as described in detail below, and the reset transistor 202, the source follower transistor 204, the selector transistor 206, the current source 208, and the power supply 210, depicted in schematic form. The image sensor 600 may be substantially similar to the image sensor element 200, described above with reference to FIG. 2. The reset transistor 202, the source follower transistor 204, the selector transistor 206, the current source 208, and the power supply 210 may be substantially similar to the similarly numbered circuit elements described above with reference to FIG. 2.

The image sensor element 600 may be fabricated by CMOS processing techniques known in the art. The image sensor element 600 includes a semiconductor substrate 606. In an embodiment, the substrate 606 is silicon in a crystalline structure. Other examples of materials suitable for the substrate 606 include other elementary semiconductors such as germanium, or compound semiconductors such as silicon carbide, gallium arsenide, indium arsenide, and indium phosphide. The substrate 606 includes an epitaxial (epi) layer grown on a substrate layer. In an embodiment, the substrate 606 includes a p− type epi layer on which one or more features, such as photodetectors, are formed. The p− layer may be formed by doping the substrate 606 with a p-type dopant such as boron, $BF_2$, or other suitable material known in the art. The doping may be accomplished using conventional processes such as ion implantation or diffusion. The epitaxial layer may include a dopant of the same type or a different type than the underlying substrate layer. In one embodiment, the epitaxial layer is a p− layer and is formed on a p+ substrate layer. In a second embodiment, the epitaxial layer is an n− layer and is formed on an n+ substrate layer. The n− layer may be formed by doping the substrate 606 with an n-type dopant such as phosphorus, arsenic, or other suitable material known in the art. The doping may be accomplished using conventional processes such as ion implantation or diffusion. In yet another embodiment, the epitaxial layer is a p− layer and is formed on an n doped substrate layer. In an embodiment, the substrate 606 has a thickness T between approximately 1 μm and 5 μm in thickness. In a further embodiment, T is between approximately 1.5 μm and 4 μm The image sensor element 600 further comprises a plurality of isolation features 612*a* and 612*b*. In an embodiment, the isolation features 612*a* and 612*b* are shallow trench isolation (STI) features. However, other isolation structures may be possible. The isolation features 612*a* and 612*b* define and isolate active regions for formation of features of the image sensor element 600. The isolation features 612*a* and 612*b* may be formed on the substrate 606 by conventional processes such as, patterning the substrate 606, etching the substrate 606 by plasma etching to form a plurality of trenches, and filling the formed trenches with a dielectric material such as silicon oxide. A guard ring well 610 is formed underlying the isolation feature 612*a*. The guard ring well 610 may a p-type well (p-well) formed by doping the substrate 606 with p-type dopants such as, boron, $BF_2$, or other suitable material known in the art. The doping may be accomplished conventional processes known in the art such as ion implantation or diffusion in a region defined by conventional photolithography processes. Other guard wells similar to guard well 610 may also be present on the substrate 606.

The image sensor element 600 also includes a photodetector. The photodetector includes a pinned-photodiode as illustrated, though other types of photodetectors are possible including photodiodes that are not pinned. The photodiode includes a photogeneration region 608 and an implant region 616 (or pinned layer) formed on the photogeneration region 608. The photogeneration region 608 may be formed by ion implantation of the substrate 608 at an area defined by conventional photolithography techniques. In an embodiment, the photogeneration region 608 is a region doped with an n-type dopant. In the embodiment, an n-type dopant such as phosphorus, arsenic, or other suitable material known in the art is implanted in the substrate 608 creating an n-type photodetector. In an embodiment, the implant region 616 is doped with a p-type dopant. The photogeneration region 608 may be formed to a depth D between approximately 0.1 μm and 3 μm.

The image sensor element 600 further includes a transfer transistor (or transfer gate transistor) formed on the substrate 606. The transfer transistor includes a transfer gate 618. The transfer gate 618 is operable to transfer charges generated in the photogeneration region 608, described above, to a floating diffusion region (or floating node) 614 that is also the drain of the transfer transistor. Thus, the floating diffusion region 614 may be located adjacent the transfer gate 618 on the side of the transfer gate 618 oppose the photodetector, for example, opposite the photogeneration region 608. The floating diffusion region 614 may be formed in the substrate 606 by ion implantation of n-type dopants such as arsenic, phosphorus, or other suitable materials known in the art. The transfer gate 618 includes a gate electrode layer 618*a* and an optically reflective layer 618*b* formed on the substrate 606. (The reflective layer 618*b* may also function as the gate electrode of the transfer gate 618). The transfer gate 618 may further include a gate dielectric layer (not illustrated) underlying the gate electrode layer 618*a*. In an embodiment, the gate dielectric layer is silicon oxide. Other examples of gate dielectrics include silicon nitride, silicon oxinitride, dielectric with a high dielectric constant (high k), and/or combinations thereof. In an embodiment, the gate electrode layer 618*a* includes a polycrystalline silicon layer. The transfer gate 618, including the gate electrode layer 618*a* and the optically reflective layer 618*b*, may have a thickness of approximately 50 Angstroms to 3000 Angstroms.

The reflective layer 618*b* may include a silicide, such as nickel silicide, cobalt silicide, tungsten silicide, tantalum silicide, titanium silicide, platinum silicide, erbium silicide, palladium silicide, and/or combinations thereof. The gate electrode including gate electrode layer 618*a* of polysilicon and a reflective layer 618*b* of silicide is a silicide-poly gate. In an embodiment, the silicide is formed by depositing a metal layer including a metal that can form a silicide such as nickel, cobalt, tantalum, titanium, platinum, erbium, palladium, and/or tungsten. The metal may be deposited using conventional processes such as physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). The metal is then annealed to form silicide. The annealing may use a rapid thermal anneal (RTA) in a gas atmosphere such as Ar, He, $N_2$, or other inert gas. A second annealing may be required to make a stable silicide. The un-reacted metal is then removed. In an embodiment, the silicide is formed by a self-aligned silicide process (salicide process). Alternatively, the optically reflective layer 618*b* may include another optically reflective material, such as a metal, including for example, a metal nitride. Examples of metals that may be included in the optically reflective layer 618*b* include copper, aluminum, tungsten, tantalum, titanium, nickel, cobalt, and/or other suitable metals. The transfer gate 618 may include additional layers, reflective or non-reflective.

In one embodiment, the transfer gate 618 is a metal gate structure. In the embodiment, the gate electrode layer 618*a* includes a metal layer. As such, the gate electrode layer 618*a* is also an optically reflective layer. In an embodiment, the gate electrode layer 618*a* includes a copper-containing metal such as, TaCu. Other examples of suitable metals that may be included in the gate electrode layer 618*a* include Cu, W, Ti, Ta, TiN, TaN, NiSi, CoSi, and/or combinations thereof. The gate electrode layer 314 may be formed by methods known in the art. For example, the metal may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). Photolithography steps may be used to pattern the metal layer to form the metal gate and a plasma etch may remove unwanted metal. In an embodiment, the reflective layer 618*b* is not present. However, additional layers, reflective or non-reflective, may be present on the gate of the photogate structure.

In yet an alternative embodiment, the transfer gate 618 is a metal gate, having a reflective, metal gate electrode layer, as described above, and further includes a second reflective layer. In the embodiment, the gate electrode layer 618*a* is a reflective, metal layer substantially as described above with reference to the previous embodiment. A second reflective layer, the reflective layer 618*b*, is also formed. The reflective layer 618*b* may be formed overlying the gate electrode layer 618*a*, as depicted, or underlying the gate electrode layer 618*a*. The reflective layer 618*b* may include a silicide such as nickel silicide, cobalt silicide, tungsten silicide, tantalum silicide, titanium silicide, platinum silicide, erbium silicide, palladium silicide, and/or combinations thereof. The silicide layer may be formed using conventional processes including those described above. In other embodiments, the reflective layer 618*b* may include a metal, including, for example, a metal nitride. Additional layers, reflective or non-reflective, may be included in the transfer gate.

As illustrated in FIG. 6, the transfer gate 618 is formed on the substrate 606 overlying the photodiode (e.g. the transfer gate 618 overlaps the photodiode). In particular, the transfer gate 618 is formed overlying (or overlapping) the photogeneration region 608. One or more layers may be present between the overlying transfer gate 618 and the underlying photodiode. The image sensor element 600 includes the transfer gate 618 overlying 100% of the photogeneration region 608. The optically reflective layer 618*b* is overlying the photogeneration region 608 and configured to provide reflection of incident radiation, as described below with reference to reflected radiation 604. In an embodiment, the gate electrode layer 618*a* includes an optically reflective material, such as found in a metal gate, and is overlying the photogeneration region 608 and configured to provide reflection of incident radiation, as described below with reference to the reflected radiation 604.

The image sensor element 600 is a backside-illuminated sensor. The image sensor element 600 is configured to sense radiation directed towards the back surface of the substrate 606, illustrated as radiation beam 602. Radiation from the backside of the substrate 606 eliminates obstructions to the optical path of the radiation that may be caused by other objects such as gate features and interconnect lines formed on the front side of the substrate 606, such the transfer gate 618. The thickness T of the substrate 606 is such that a radiation beam 602 effectively reaches the photogeneration region 608. The radiation beam 602 may be a visual light beam, an infrared (IR) beam, an ultraviolet (UV) beam, and/or other proper radiation beam.

At least a portion of the radiation beam 602 incident on the back surface of the substrate 606 is not absorbed by the substrate 606 and/or the photogeneration region 608 when passing from the back surface of the substrate 606 to and through the photogeneration region 608. Non-absorbed radiation can lead to a decrease in image sensor sensitivity. In the image sensor 600, radiation passing through the substrate 606 and/or the photogeneration region 608 is reflected back towards the photogeneration region 608 (and towards the back surface of the substrate 606) by the reflective material included in the transfer gate 618. In particular, the radiation beam 602 may be reflected by the reflective layer 618*b*, as illustrated by reflected radiation 604. In alternative embodiments, the gate electrode layer 618*a* includes optically reflective material and as such, the gate electrode layer 618*b* provides the reflected radiation 604. The reflected radiation 604 may pass to and through the photogeneration region 608.

Figure 7:
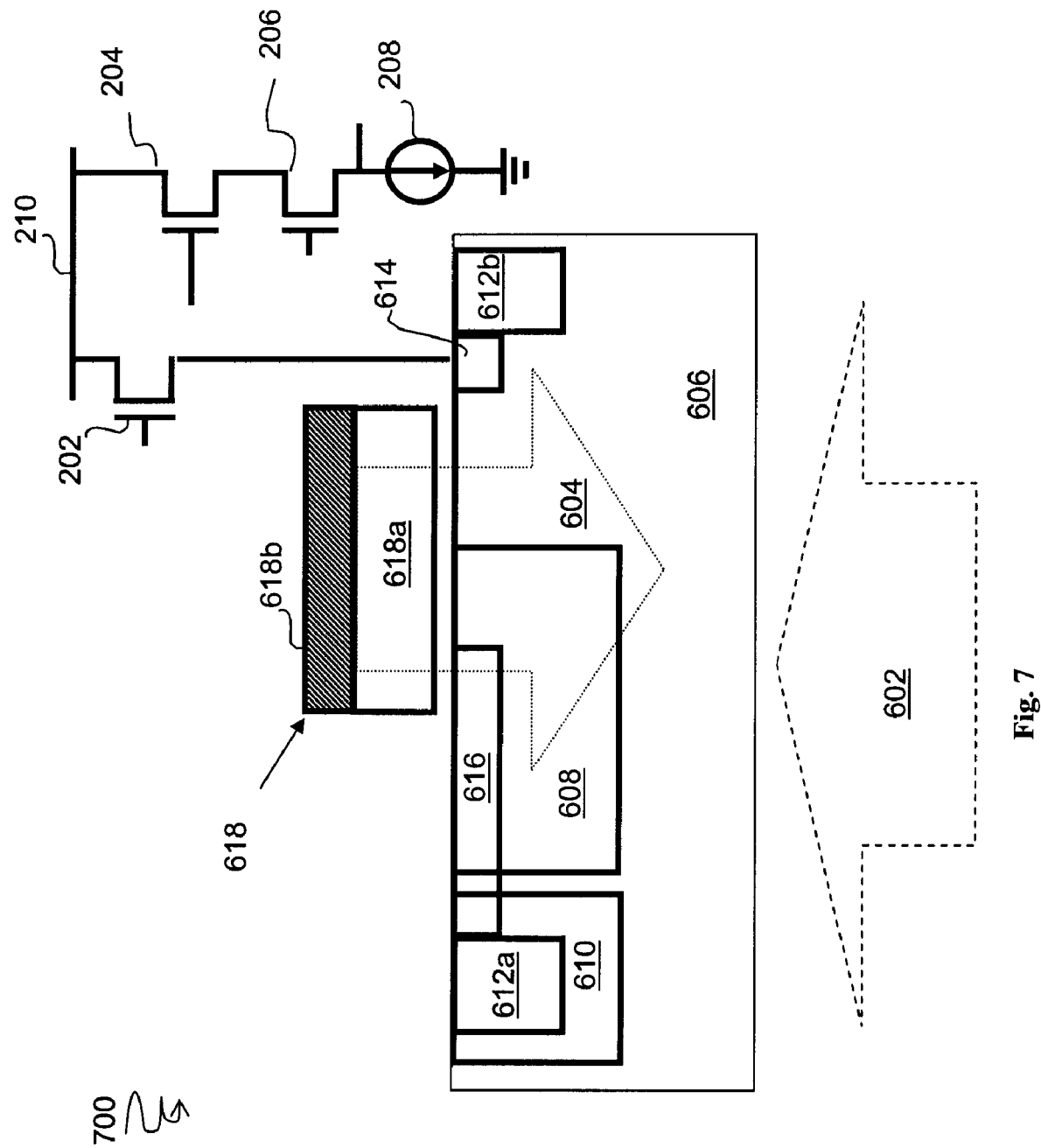
FIG. 7 is a cross-section of an alternative embodiment of an image sensor element of a backside-illuminated image sensor device benefiting from the current disclosure.

Referring now to FIG. 7, an image sensor element 700 is illustrated. The image sensor element 700 is substantially similar to the image sensor element 600, except in the positioning of the transfer gate 618 in relation to the photodetector. The image sensor element 700 also includes the transfer gate 618 overlying a photodiode. In particular, the transfer gate 618, including the reflective layer 618*b* and the gate electrode layer 618*a*, overlies the photogeneration region 608. In contrast to the image sensor element 600, described above with reference to FIG. 6, however, the transfer gate 618 overlies less than 100% of the photogeneration region 608. Though depicted as overlying (or overlapping) approximately 50% of the photogeneration region 608, the transfer gate 618 may overlie any portion or percentage of the photogeneration region 608. The transfer gate 618 may overlie greater than approximately 5%. As such, an optically reflective material of the transfer gate overlies at least approximately 5% of the photogeneration region 608.

The formation of a transistor gate may require photolithography processes including deposition of photoresist on the substrate to provide for patterning the gate, etching processes, and subsequent removal of the photoresist. Processes such as etching, including for example photoresist removal, may cause damage to a surface of the substrate. In an image sensor element such as the image sensor element 300 and/or the image sensor element 500, the surface of the substrate 304 including the photodiode (e.g. the surface of the implant region 308 and/or the photogeneration region 306) is exposed to processes that may damage the surface. The damage may be detrimental to the operability of the implant region 308 and/or the photogeneration region 306. In contrast, in the image sensor element 600 and/or the image sensor element 700, the transfer gate 618 is formed overlying the implant region 616 and the photogeneration region 608. Thus, the transfer gate 618 protects the surface of the implant region 616 and the photogeneration region 608 from potentially damaging processes. Furthermore, the image sensor element 600 and/or the image sensor element 700 configurations including a gate overlying a photodetector, may allow a charged electron to see a decreased barrier to transfer from the photogeneration region 608 to the floating diffusion region 614. This decreased barrier can lead to increased device performance such as, reducing image lag. The barrier may be decreased because the implant region (or pinning layer) 616 may be disposed further from the similarly doped substrate 604 that interposes the photogeneration region 608 and the floating diffusion node 614. The image sensor element 600 and/or the image sensor element 700 configurations also provides a larger transfer gate as compared to, for example, the image sensor element 300 and/or the image sensor element 500, illustrated above with reference to FIGS. 3 and 5. The larger transfer gate allows for reduced opportunity for "punch-through."

Other performance advantages of the image sensor element 600 and/or the image sensor element 700 may include increased quantum efficiency for a given substrate thickness. In one experimental embodiment, an image sensor element is provided that includes a transfer gate with a gate electrode layer having a thickness of 1800 Angstroms of polysilicon and an overlying optically-reflective layer of cobalt silicide having a thickness of 86 Angstroms. The gate electrode layer may be substantially similar to the gate electrode layer 618a; the optically-reflective layer may be substantially similar to the reflective layer 618b. The image sensor element further includes a pinned photodiode type photodetector. The pinned photodiode includes a pinned layer having a peak depth of approximately 0.05 μm and a dose of approximately 3E18 atoms/cm$^3$ and a photogeneration region having a peak depth of approximately 0.09 μm and a dose of approximately 1E17 atoms/cm$^3$. The pinned layer may be substantially similar to implant region 616; the photogeneration region may be substantially similar to photogeneration region 608. In the experimental embodiment, an incident radiation beam of visible light having a wavelength of 650 nm is provided to the image sensor element. The experimental embodiment showed that the quantum efficiency for an image sensor element having a 3.5 μm thick substrate and a transfer gate overlying 25% of a photodiode was substantially equal to the quantum efficiency for an image sensor element having a 4.0 μm thick substrate and no overlap of a transfer gate and a photodiode.

In a second experimental embodiment, an image sensor element is provided that includes a transfer gate with a gate electrode layer having a thickness of 1800 Angstroms of polysilicon and an overlying optically-reflective layer of cobalt silicide having a thickness of 86 Angstroms. The gate electrode layer may be substantially similar to the gate electrode layer 618a; the optically-reflective layer may be substantially similar to the reflective layer 618b. The image sensor element further includes a pinned photodiode type photodetector. The pinned photodiode includes a pinned layer having a peak depth of approximately 0.05 μm and a dose of approximately 3E18 atoms/cm$^3$ and a photogeneration region (or photodiode region) having a peak depth of approximately 0.09 μm and a dose of approximately 1E17 atoms/cm$^3$. The pinned layer may be substantially similar to the implant region 616; the photogeneration region may be substantially similar to the photogeneration region 608. In the experimental embodiment, an incident radiation beam of visible light having a wavelength of 650 nm is provided to the image sensor element. The experimental embodiment showed that the quantum efficiency for an image sensor element having a 1.5 μm thick substrate and a transfer gate overlying 50% of a photodiode was substantially equal to the quantum efficiency for an image sensor element having a 2.0 μm thick substrate and no overlap of a transfer gate and a photodiode.

The image sensor elements 110 of image sensor device 100, described above with reference FIG. 1, may include the image sensor element 600 and/or the image sensor element 700. The image sensor elements 600 and/or the image sensor element 700 may further include a color filter disposed over the back surface of the substrate 606. The image sensor elements 600 and/or the image sensor element 700 may further include a lens disposed over the back surface of the substrate 606. The radiation beam 602 may pass through the color filter and/or the lens before being incident on the back surface of the substrate 606.

Figure 8:
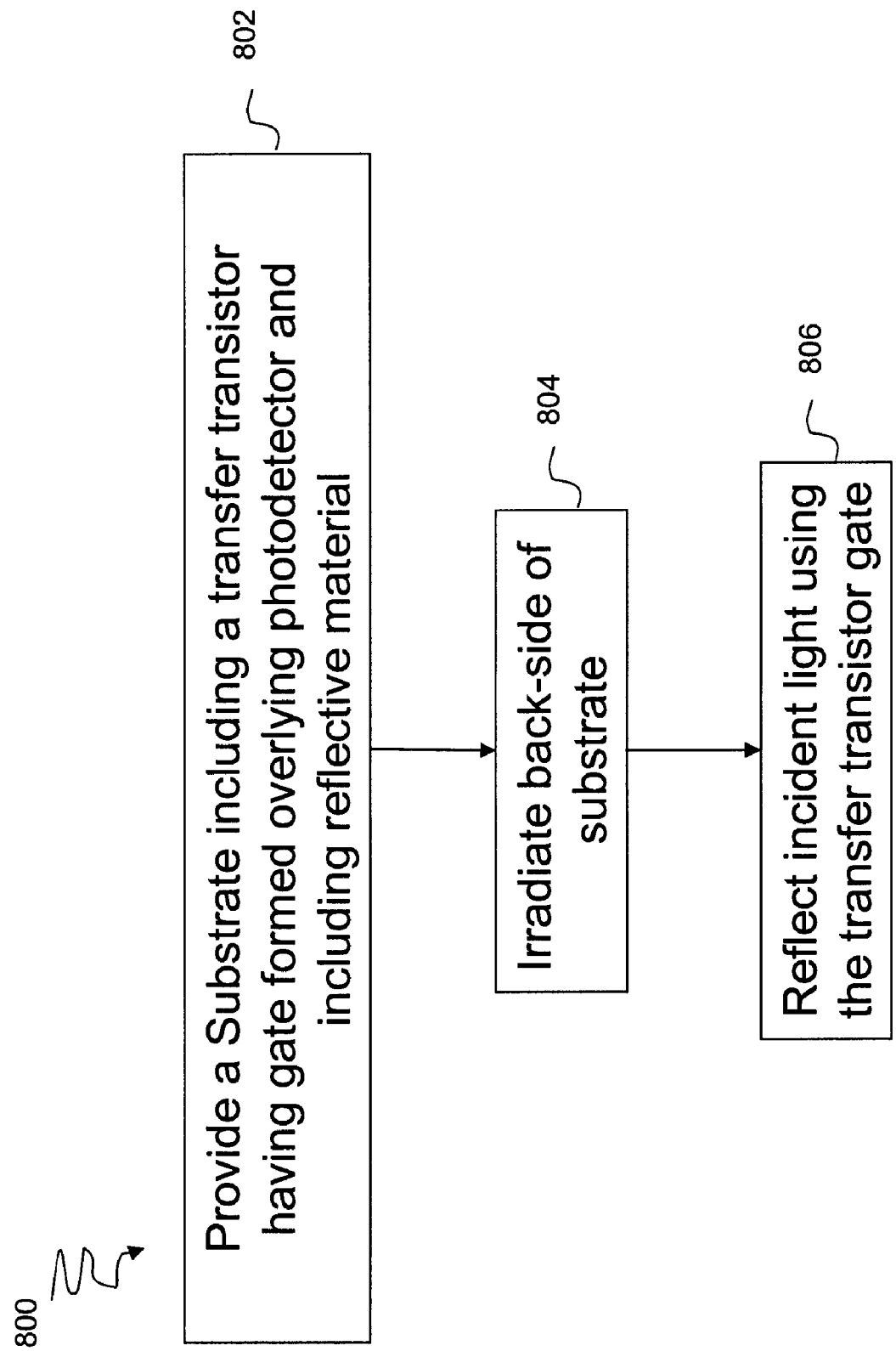
FIG. 8 is a flow-chart illustrating an embodiment of a method of operating a backside-illuminated image sensor.

Referring now to FIG. 8, illustrated is a method 800 for operation of a backside-illuminated image sensor. The method 800 begins at step 802 where a substrate is provided. The substrate provided may be the substrate 606, described above with reference to FIGS. 6 and 7. The substrate includes a photodetector. The photodetector may be substantially similar to the photodiodes described above with reference to FIGS. 6 and 7. The substrate also includes a gate of a transistor. The gate of the transistor is disposed overlying at least a portion of the photodetector. The gate may be substantially similar to the transfer gate 618, also described above with reference to FIGS. 6 and 7. The gate overlying at least a portion of the photodetector also includes an optically reflective material. The gate and the optically reflective material are configured such that the optically reflective material is at least partially overlying the photodetector. The optically reflective material may be substantially similar to the reflective material 618b, described above with reference to FIGS. 6 and 7. The method 800 then proceeds to step 804 where the backside of the substrate is irradiated. The radiation may be a visual light beam, an infrared (IR) beam, an ultraviolet (UV) beam, and/or other proper radiation beam. The method 800 then proceeds to step 806 where a portion of the radiation incident the back surface of the substrate is reflected by the optically reflective material of the gate. The reflected radiation is directed towards the photodetector. In particular, the reflected radiation is that radiation that was not absorbed by the substrate including the photodetector as it first passed from the backside of the substrate towards the gate. The method 800 may allow for increasing the amount of absorbed radiation, which leads to increased sensitivity of the image sensor device.

Thus, the present disclosure provides a backside-illuminated sensor including a semiconductor substrate having a front surface and a back surface. A plurality of image sensor elements are formed on the front surface of the semiconductor substrate. At least one image sensor element includes a transfer transistor and a photodetector. The gate of the transfer transistor overlies the photodetector. The gate also includes an optically reflective layer.

Also provided is a back-side illuminated sensor including a substrate. The substrate having a first type of conductivity. A transfer gate is formed on the substrate and includes an optically reflective material. A photogeneration region is formed on the substrate underlying the transfer gate. The transfer gate overlies at least a portion of the photogeneration region. In one embodiment, the transfer gate overlies at least 25% of the photogeneration region.

Further provided is an apparatus including a substrate having a first surface and a second surface. A photodetector formed adjacent the second surface of the substrate. A transistor including an optically reflective layer is formed on the second surface of substrate and disposed over the photodetector. The optically reflective layer is configured to reflect a radiation beam incident on the first surface of the substrate towards the photodetector.

Although only a few exemplary embodiments of this invention have been described in detail above, those skilled in the art will readily appreciate that many modifications are possible in the exemplary embodiments without material departing from the novel teachings and advantages of this disclosure. It is again noted that the embodiments illustrated in FIGS. 6 and 7 are exemplary only and not intended to be limiting in any manner. For example, though a 4T structure image sensor element is illustrated, other structures of image sensor elements are possible. Furthermore, though a photodetector including a pinned photodiode is illustrated, other photodetector types are also certainly possible and within the scope of the current disclosure including, for example, photodiodes, photogate structures, phototransistors, or other suitable detector types. Likewise, though the overlying transistor gate including reflective material is depicted as the transfer transistor, other configurations are possible such that a transistor having a different function overlies the photodetector and includes a reflective material. Similarly, the present disclosure may apply, at a minimum, to CMOS image sensors (CIS) as well as CCD devices.

What is claimed is:

1. A backside-illuminated sensor comprising:
a semiconductor substrate having a front surface and a back surface; and
a plurality of image sensor elements formed on the front surface of the semiconductor substrate, wherein at least one image sensor element comprises a transfer transistor and a photodetector and wherein a gate of the transfer transistor comprises a reflective layer and wherein the reflective layer of the gate substantially overlies the photodetector;
wherein the photodetector includes a pinned-photodiode and wherein the reflective layer completely overlies the pinned-photodiode.

2. The sensor of claim 1, further comprising
at least one well formed on the semiconductor substrate between the plurality of image sensor elements; and
an isolation structure formed in the at least one well.

3. The sensor of claim 1, wherein the reflective layer includes silicide.

4. The sensor of claim 1, wherein the reflective layer includes a material selected from the group consisting of nickel silicide, cobalt silicide, tungsten silicide, tantalum silicide, titanium silicide, platinum silicide, erbium silicide, palladium silicide, Cu, W, Ti, Ta, TiN, TaN, and combinations thereof.

5. The sensor of claim 1, wherein the photodetector includes a photodiode, and wherein the reflective layer completely overlies the photodiode.

6. The sensor of claim 1, wherein the photodetector is operable to detect radiation incident on the back surface of the substrate, and wherein the photodetector is further operable to detect radiation reflected from the reflective layer.

7. The sensor of claim 1, wherein the at least one image sensor element further comprises a reset transistor, a source follower transistor, and a selector transistor.

8. The sensor of claim 1, wherein the semiconductor substrate includes a thickness between approximately 1 μm and 5 μm.

9. A back-side illuminated sensor, comprising:
a substrate;
a transfer gate formed on the substrate and including an optically reflective material;
a photogeneration region formed on the substrate underlying the transfer gate, wherein the photogeneration region has a first surface opposing the substrate, whereby the optically reflective material of the transfer gate substantially overlies the entire photogeneration region; and
a pinned photodiode including the photogeneration region, wherein the optically reflective material of the transfer gate substantially overlies the entire pinned photodiode.

10. The sensor of claim 9, further comprising:
a floating diffusion region formed on the substrate adjacent to and at one side of the transfer gate, the one side being away from and opposite the photogeneration region.

11. A back-side illuminated sensor, comprising:
a substrate;
a transfer gate formed on the substrate and including an optically reflective material;
a phtogeneration region formed on the substrate underlying the transfer gate, wherein the photogeneration region has a first surface opposing the substrate, whereby the optically reflective material of the transfer gate substantially overlies the entire photogeneration region; and
a pinned layer including an implanted region formed on the photogeneration region, wherein the implanted region has a first type of conductivity and the photogeneration region has a second type of conductivity, and wherein the substrate has the first type of conductivity.

12. An apparatus comprising:
a substrate including a first surface and a second surface;
a photodetector formed adjacent the second surface of the substrate, wherein the photodetector includes a photogeneration region and a pinned layer;
a first transistor including a gate having an optically reflective layer formed on the second surface of substrate, wherein the gate and the optically reflective layer are disposed to substantially overlie the entire photogeneration region and the pinned layer, wherein the optically reflective layer is configured to reflect a radiation beam incident on the first surface of the substrate towards the photodetector.

13. The apparatus of claim 12, wherein the first transistor is a transfer transistor and a gate electrode of the transfer transistor includes the optically reflective layer.

14. The apparatus of claim 12, wherein the radiation beam incident the first surface passes through the photodetector before being reflected by the optically reflective layer.

* * * * *